US007332899B2

(12) United States Patent
Muellauer (10) Patent No.: US 7,332,899 B2
(45) Date of Patent: Feb. 19, 2008

(54) CIRCUIT ARRANGEMENT FOR MONITORING A VOLTAGE SUPPLY, AND FOR RELIABLE LOCKING OF SIGNAL LEVELS WHEN THE VOLTAGE SUPPLY IS BELOW NORMAL

(75) Inventor: Markus Muellauer, Friesach (AT)

(73) Assignee: Infineon Technologies AG, Munich (DE)

( * ) Notice: Subject to any disclaimer, the term of this patent is extended or adjusted under 35 U.S.C. 154(b) by 391 days.

(21) Appl. No.: 11/041,315

(22) Filed: Jan. 24, 2005

(65) Prior Publication Data

US 2005/0168201 A1 Aug. 4, 2005

(30) Foreign Application Priority Data

Jan. 30, 2004 (DE) .................... 10 2004 004 729

(51) Int. Cl.
*G05F 1/40* (2006.01)
*G05F 1/56* (2006.01)
*H02H 7/00* (2006.01)

(52) U.S. Cl. ...................... 323/282; 323/271

(58) Field of Classification Search ............... 323/265, 323/268, 270, 271, 273, 282; 327/77, 80, 327/81, 378, 530, 535, 538
See application file for complete search history.

(56) References Cited

U.S. PATENT DOCUMENTS 4,789,917 A 12/1988 Miller

| 4,902,910 A | 2/1990 | Hsieh | |
|---|---|---|---|
| 6,198,308 B1 * | 3/2001 | Morrill | ......................... 326/83 |
| 6,788,037 B2 * | 9/2004 | Chevallier et al. | .......... 323/282 |
| 6,936,998 B2 * | 8/2005 | Cho | ........................... 323/280 |

FOREIGN PATENT DOCUMENTS

| DE | 0999493 | 5/2000 |
|---|---|---|
| DE | 10033035 | 2/2001 |

OTHER PUBLICATIONS

German Office Action dated May 17, 2005.

* cited by examiner

*Primary Examiner*—Matthew V. Nguyen
(74) *Attorney, Agent, or Firm*—Jenkins, Wilson, Taylor & Hunt, P.A.

(57) ABSTRACT

A circuit arrangement for monitoring an external voltage supply (VBAT1, VBAT2) and for reliable locking of a signal (Z2), which is emitted from a logic circuit (8), at a voltage level (VDD, VSS) of an internal voltage supply, wherein the circuit arrangement has a voltage divider (6, 7), which is connected between a first and a second external supply voltage (VBAT1, VBAT2) and produces a potential level (VLOCK) for a switching signal; a controllable switch (13) which separates the internal voltage supply, which has a first and a second internal supply voltage (VDD, VSS), from the logic circuit (8) in order to deactivate the latter as a function of a locking signal (LOCKP) which is produced from the switching signal; and a high-value resistor (14) by means of which the signal (Z2) which is emitted from the deactivated logic circuit (8) is drawn to the level of one of the two internal supply voltages (VSS).

10 Claims, 5 Drawing Sheets

CIRCUIT ARRANGEMENT FOR MONITORING A VOLTAGE SUPPLY, AND FOR RELIABLE LOCKING OF SIGNAL LEVELS WHEN THE VOLTAGE SUPPLY IS BELOW NORMAL

DESCRIPTION

Circuit arrangement for monitoring a voltage supply, and for reliable locking of signal levels when the voltage supply is below normal

1. Technical Field

The invention relates to a circuit arrangement for monitoring an external voltage supply and for reliable locking of a signal which is emitted from a logic circuit at a voltage level of an internal secondary voltage supply.

2. Background Art

Most mobile electronic applications include a battery or a rechargeable battery for supplying current and voltage. During operation, this external supply voltage decreases down to a complete discharge level, or else the external supply voltage even collapses completely when the user replaces the rechargeable battery.

Electronic, mobile applications such as mobile telephones or electronic notebooks such as PDAs (Personal Digital Assistants) also often have to provide at least rudimentary functions even when the battery is discharged. For this purpose, a second back-up battery or a large buffer capacitor is generally provided, which produces an internal supply voltage for a limited time period. This auxiliary supply voltage may fall to very low values which are well below the nominal supply voltages for the circuits that are used in the electronic appliance.

Appliance electronics typically include a large number of integrated circuits, which are designed using different technologies. Those integrated circuits which have to provide the rudimentary functions are then designed, for example, using a particularly power-saving technology (for example CMOS technology), so that the functions, for example a real time clock, operate even when the secondary voltage supply is at an extreme level. These circuits which provide rudimentary functions are designed as circuits which require low voltages.

If the external supply voltage decreases as a result of discharging or removal of the rechargeable battery, it is necessary to reliably generate reset signals or other control signals which indicate to the low-voltage circuits that only rudimentary operation should be provided by the battery during the failure of the main power supply or voltage supply. In this case, it is important for the circuits which produce the reset signals to produce reliable, logic levels for the reset signal or control signal bearing in mind the changing, very low supply voltage.

Without special measures, the logic levels of digital signals in logic circuits whose supply voltage is below the nominal value for the corresponding technology (for example BiCMOS) become unreliable. Inter alia, this is because the signal levels which occur when the voltage supply is below normal are no longer adequate to correctly drive the gates of switching transistors in the logic circuit. The output signals then fluctuate unreliably between an H (High) and L (Low) level, or are at an undefined level between these two levels. Special measures are therefore required in order to produce well-defined H and L levels for the respective control signal even when the supply voltage is below normal.

According to the prior art, circuit arrangements with pull-up or pull-down resistors are known for CMOS logic devices.

Figure 1:
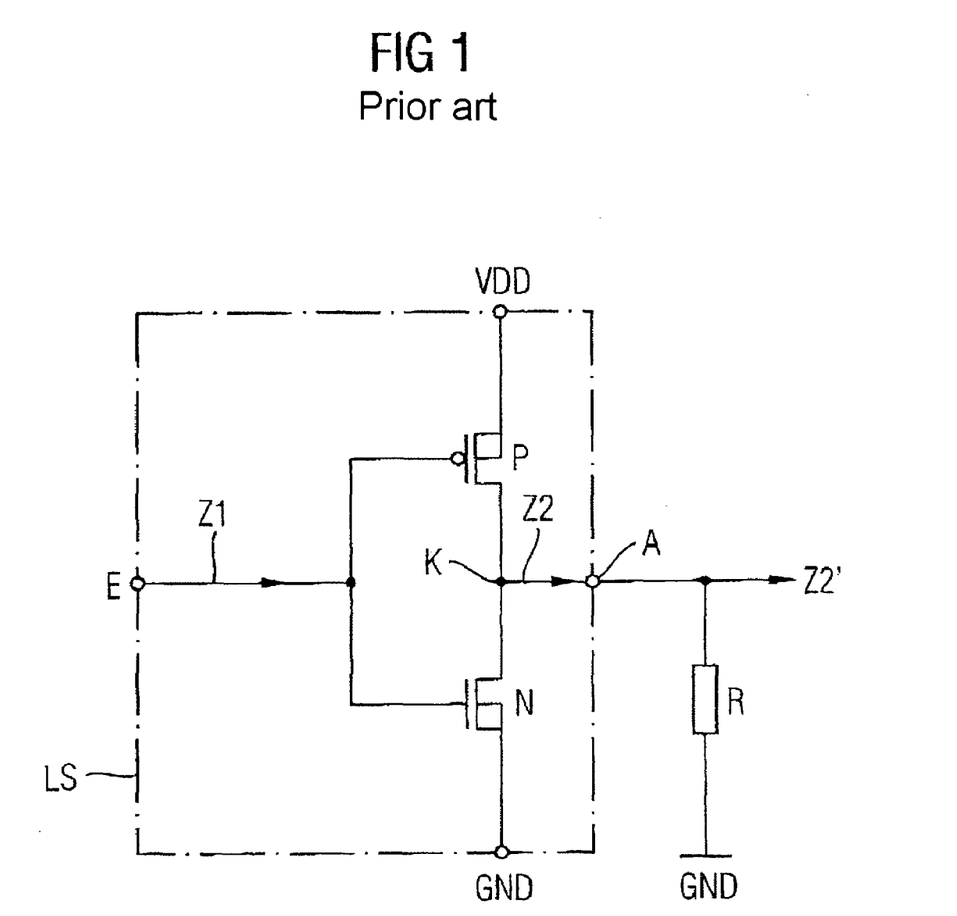
FIG. 1 shows a circuit with a pull-down resistor according to the prior art.

FIG. 1 shows a circuit according to the prior art. The logic circuit LS is formed by an inverter which has an input E and an output A, having a PMOS transistor P and an NMOS transistor N, whose controllable paths are connected in series between the supply voltage VDD and ground GND, with the gate connections of the MOS transistors being connected to one another at the input E for an input signal Z1. The output A is coupled to a node K between the two controllable paths through the MOS transistors P, N. Furthermore, a pull-down resistor R is connected to the output A and draws a signal Z2, which is produced at the output, to ground GND when the voltage supply is below normal.

Logic circuits LS and inverters such as these are generally used as output drivers by more general logic circuits. During normal operation, that is to say when the voltage supply is adequate, an input signal Z1 is inverted to form the output signal Z2, and is emitted at the output A. However, if the supply voltage VDD falls well below the nominal supply voltage (which is governed by the technology used, for example CMOS), the transistors P, N no longer operate reliably, and can no longer produce any currents. In this situation, the pull-down resistor R "wins" and draws the potential at the output A to the L level, or to ground GND. This zero or L level of the output control signal Z2' is reliably maintained until the supply voltage VDD collapses completely.

The circuit arrangement according to the prior art in FIG. 1 with a pull-down resistor has the major disadvantage that current is dissipated via the resistor R during normal operation as well if the PMOS transistor P is driven by the input signal Z1 in order to produce an H level as the output signal at the output A. The increased power consumption thus leads to rapid discharging of the battery and hence to the corresponding appliance having a short operating period.

The European Patent Application EP 0 999 493 A2 describes a circuit arrangement for voltage monitoring and for production of a reset signal. The corresponding CMOS circuit requires a reference voltage source and a comparator circuit. The circuit is provided in an appliance which has circuits from different technologies, and is thus designed using that technology which can operate at the lowest possible supply voltage—in comparison to the other integrated circuits in the appliance. The use of the low-voltage circuit to produce the reset signals has the disadvantage that the logic gates using this very low-voltage technology also fail beyond a specific supply voltage level, and the reset signals then fluctuate as a function of parasitic leakage currents. A further disadvantage is that the respective low-voltage technology cannot be supplied directly from the battery or rechargeable battery supply voltage. Furthermore, the voltage threshold down to which a well-defined H level or L level can be emitted as a reset signal or locked signal is dependent on the power consumption of the comparator and of the reference voltage source.

SUMMARY OF THE INVENTION

The object of the invention is thus to provide a circuit arrangement for monitoring a power supply and for reliable locking of signal levels when the supply voltage is below normal, which reliably produces a well-defined logic level down to extremely low residual supply voltages, saves power and can be integrated with little effort.

The object is achieved by a circuit arrangement for monitoring a voltage supply and for reliable locking of a signal emitted from a logic circuit at a supply voltage level when an external supply voltage level decreases, having the features of Patent Claim 1.

Advantageous refinements and developments of the invention can be found in the respective dependent claims.

Accordingly, a circuit arrangement for monitoring an external voltage supply and for reliable locking of a signal, which is emitted from a logic circuit, at a voltage level of an internal voltage supply that is below normal, is provided which has a voltage divider which is connected between a first and a second external supply voltage and produces a potential level for a switching signal. The circuit arrangement according to the invention furthermore has a controllable switch which separates the internal voltage supply, which has a first and a second internal supply voltage, from the logic circuit in order to deactivate the latter as a function of a locking signal which is produced from the switching signal. In addition, a high-value resistor is provided, by means of which the signal which is emitted from the deactivated logic circuit is drawn to the level of one of the two internal supply voltages.

The circuit arrangement according to the invention has the advantage that it sets the signal emitted from the logic circuit to one of the two internal supply voltage levels even when the supply voltages are very low, and in practice down to complete collapse of the external voltage supply, and hence of the internal voltage supply as well. The circuit arrangement thus produces a reliable signal which is logically referenced to one of the internal supply voltage levels and follows the respective decreasing internal supply voltage level. Since the resistor is designed to have a high resistance, virtually no additional power is consumed, in comparison to the prior art.

The voltage divider in the circuit arrangement according to the invention is advantageously designed such that, when the logic circuit is processing an input signal which is referenced to the external supply voltages, the locking signal deactivates the logic circuit before the level or levels of the input signal received from the logic circuit becomes or become unacceptable in the event of a drop in the external supply voltages. This advantageously means that the circuit arrangement produces the locked signal before the input signal (which is referenced or referred to the external supply voltages) to the logic circuit fluctuates between the H level and the L level, and is thus no longer well-defined, owing to the external supply voltages being too low.

According to one preferred embodiment of the circuit arrangement according to the invention, a monitoring circuit is provided, which has a first supply voltage connection for application of the first external supply voltage, a second supply voltage connection for application of the second external supply voltage, and at least one output for emission of the locking signal.

In this case, at least two resistors are connected as a voltage divider between the supply voltage connections, and the locking signal is produced as a function of a voltage potential which can be tapped off between the resistors.

The logic circuit has a first supply voltage connection and a second supply voltage connection, with the second internal supply voltage being applied to the second supply voltage connection, a control signal input for an input signal, and an output for the signal which is produced from the input signal by the logic circuit.

The controllable switch is provided between the first internal supply voltage and the first supply voltage connection of the logic circuit, and connects the first internal supply voltage to the first supply voltage connection of the logic circuit as a function of the locking signal. The high-value resistor is provided between the output of the logic circuit and the second internal supply voltage.

In one preferred embodiment, the internal and external first supply voltages and the internal and external second supply voltages are each at the same voltage level. In this case, the circuit arrangement according to the invention ensures reliable self-locking of the output signal when the supply voltage collapses.

According to one preferred development of the circuit arrangement according to the invention, the monitoring circuit has a third supply voltage connection for application of the first internal supply voltage, and has a fourth supply voltage connection for application of the second internal supply voltage.

Furthermore, the monitoring circuit has a third resistor, a first MOS transistor with a controllable path and a gate connection, and a second MOS transistor with a controllable path and a gate connection, wherein the third resistor and the two controllable paths are connected in series between the two internal supply voltages and the switching signal is coupled to the gate connection of the second MOS transistor.

The monitoring circuit furthermore provides a complementary MOS transistor with a controllable path and a gate connection, and has a fourth resistor, wherein the controllable path through the complementary MOS transistor and the fourth resistor are connected in series between the two internal supply voltages. The gate connection of the complementary MOS transistor is connected to a potential node between the third resistor and the controllable path through the first MOS transistor, and the gate connection of the first MOS transistor is connected between the controllable path through the complementary MOS transistor and the fourth resistor.

According to the preferred development, the monitoring circuit has a third MOS transistor with a controllable path and a gate connection, wherein the controllable path through the third MOS transistor is connected between the gate connection of the complementary MOS transistor and the second internal supply voltage. The switching signal is connected to the gate connection of the third MOS transistor. The monitoring circuit produces a first locking signal which can be tapped off at the gate connection of the complementary MOS transistor, and a second locking signal which can be tapped off at the gate connection of the first MOS transistor.

The preferred development offers two locking signals, so that an output level from connected logic circuits is locked either at a level which is referenced to the first internal supply voltage or at a level which is referenced to the second internal supply voltage.

According to a further advantageous development of the circuit arrangement according to the invention, the monitoring circuit furthermore has a first and a second MOS control transistor, which each have a controllable path and a gate connection. In this case, the controllable path through the first MOS control transistor is connected between the controllable path through the first and the second MOS transistor, and the controllable path through the second MOS transistor is connected between the gate connection of the complementary MOS transistor and the controllable path through the third MOS transistor. An external control signal is applied to the gate connections of the two MOS control transistors.

This advantageous development furthermore provides locking at in each case one of the two internal supply voltage levels by means of the external control signal, even at the nominal external supply voltage.

In one preferred embodiment of the circuit arrangement according to the invention, the controllable switch or switches has or have an MOS switching transistor with a controllable path and a gate connection, with the locking signal being connected to the gate connection of the respective MOS switching transistor. The controllable path through the MOS switching transistor is provided between one of the internal supply voltages and a supply voltage connection of the respective logic circuit.

The logic circuit preferably has an inverter as the output driver. During normal operation, an inverter offers the advantage that the output level from the logic circuit is well-defined, and that the high-value resistor according to the invention can easily be connected to one output.

The circuit arrangement according to the invention is preferably designed using a first MOS technology, and the control signals from the logic circuits drive circuits which are designed using a second technology. In this case, it is particularly advantageous for the first technology to operate at higher supply voltages than the second technology. In this case, the circuit arrangement according to the invention is provided in a domain which, for example, can be directly connected to the external or battery supply voltage and supplies reliable, possibly locked, control signals to circuits in a low supply voltage domain.

Further advantageous refinements and a development of the invention are the subject matter of the dependent claims and of the description, with reference to the figures.

The invention will be explained in more detail in the following text with reference to the exemplary embodiments and the schematic figures, in which:

BRIEF DESCRIPTION OF THE DRAWINGS

Identical or functionally identical elements in the figures are provided with the same reference symbols.

DETAILED DESCRIPTION OF THE DRAWINGS

FIG. 1 has already been described in the introduction to the description.

Figure 2:
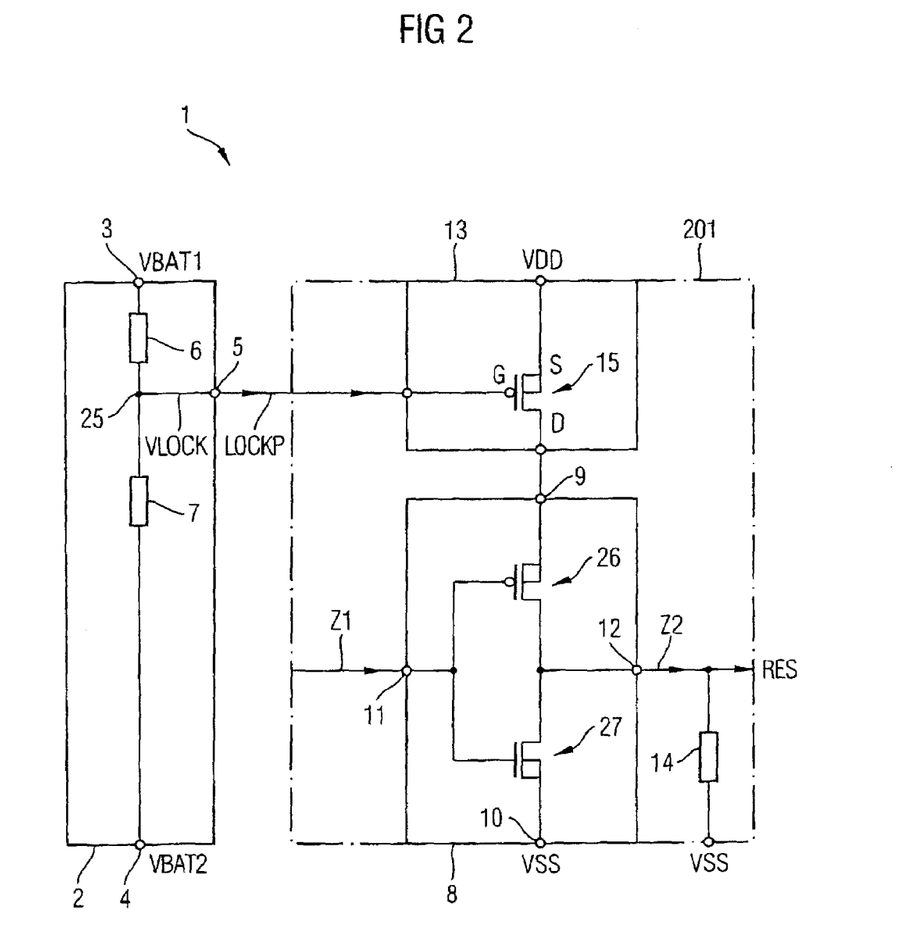
FIG. 2 shows a circuit arrangement according to one preferred embodiment of the invention.

FIG. 2 shows a circuit arrangement according to a first preferred embodiment of the invention.

The circuit arrangement 1 has a monitoring circuit 2 which has a first supply voltage connection 3 for application of the first external supply voltage VBAT1, a second supply voltage connection 4 for application of the second external supply voltage VBAT, two resistors 6, 7 which are connected in series between the supply voltage connections 3, 4, and an output 5 which is connected to a potential node 25 between the two resistors 6, 7. A voltage potential VLOCK is dropped at the potential node 25, and can be tapped off as a locking signal LOCKP at the output 5.

The locking signal LOCKP is passed to a functional block 201, which has an inverter as the logic circuit 8 and a PMOS switching transistor 15 as the controllable switch 13, as well as a high-value resistor 14 which is connected to an output 12 of the logic circuit and to a second internal supply voltage VSS.

The controllable path through the PMOS switching transistor 15 is connected between the first internal supply voltage VDD and a first supply voltage connection 9 of the logic circuit 8. The locking signal LOCKP is passed to the gate connection of the PMOS switching transistor 15.

The logic circuit 8 or the inverter has a PMOS transistor 26 and an NMOS transistor 27, whose controllable paths are connected between the first supply voltage connection 9 of the logic circuit 8 and a second supply voltage connection 10, to which the second internal supply voltage VSS is applied. The gate connections of the PMOS transistor 26 and of the NMOS transistor 27 are connected to one another, and are jointly connected to the input 11 of the logic circuit 8. The input 11 is supplied with a control signal Z1 which is related to the external supply voltage level BAT1, BAT2. In this case, it is not essential for an H level to correspond to the first external supply voltage. It may also be proportional to the external supply voltage, or may be referenced to it by means of some other non-linear relationship. The inverted input signal can be tapped off as the output signal Z2 between the controllable paths of the MOS transistors 26, 27, and is passed to the output 12 of the inverter 8.

By way of example, the following text is based on the assumption that a logic H level corresponds to the first external supply voltage VBAT1, and that a logic L level corresponds to the second external supply voltage VBAT2. Other references for the logic levels are, of course, also possible. When the external supply voltages VBAT1, VBAT2 are at the nominal values for the respective technology used for the design of the higher-level circuits, which are not considered here, and, in particular, provide the input signal Z1 for the logic circuit, the PMOS switching transistor 15 has a low impedance as a result of the locking signal LOCKP, and passes the first supply voltage VDD to the inverter 8. The resistors 6, 7 in the voltage divider have resistances such that the controllable switch 13 passes on the internal supply voltage VDD to the logic circuit 8 or the inverter during normal operation, that is to say with the nominal external supply voltage (which, in particular, supplies higher-level circuit parts which generally require higher voltages than VDD, VSS).

If the external supply voltage VBAT1 decreases, for example in the event of a battery being discharged, the PMOS transistor 15 impedance becomes continuously high owing to the falling level VLOCK of the locking signal LOCKP. In the situation where, for example, the external and internal supply voltage levels are the same, VBAT1=VDD and VBAT2=VSS, the voltage between the source S of the MOS switching transistor 15 which faces the first supply voltage VDD and the gate G of the MOS switching transistor which is at the voltage potential which is dropped across the voltage divider 6, 7 falls when the supply voltage range decreases. In consequence, the MOS switching transistor 15 cuts off the logic circuit 8 when the voltage supply falls, and deactivates it.

The following text is based on the assumption that VBAT1=VDD and VBAT2=VSS in this preferred embodiment.

If the input signal Z1 to the logic circuit 8 indicates by means of an H level that there is a voltage drop in the supply voltage VDD, VSS, or that the circuit or appliance in which the circuit arrangement according to the invention is used has run down as a consequence of this, the output control signal Z2 from the inverter or from the logic circuit 8 is emitted as a reset signal RES at the L level.

Before the supply voltage VDD, VSS becomes so low that the MOS transistors 26, 27 in the logic circuit 8 can no longer operate, the impedance of the controllable path through the MOS switching transistor 15 becomes high, and the logic circuit 8 is thus deactivated by interrupting the supply voltage. This is done because the gate connection of the MOS switching transistor 15 follows the supply voltage level VDD.

When the logic circuit 8 has been deactivated, the output signal Z2 from the logic circuit 8 at the output 12 follows the second supply voltage level VSS, that is to say an L level, via the high-value resistor 14. Thus, when the supply voltages VDD, VSS and the supply voltage range VDD-VSS are far lower than the nominal value for the respective technology used for the design of the circuit arrangement, for example CMOS, this therefore ensures that the output control signal Z2 is locked at an L level as a reset signal RES. The locking at the L level takes place reliably virtually down to a negligibly small supply voltage range VDD-VSS.

During normal operation, that is to say at the nominal supply voltages VDD, VSS, only an insignificantly greater amount of current is drawn in the circuit arrangement according to the invention, since the resistor 14 can be chosen to have a very high value.

Figure 3:
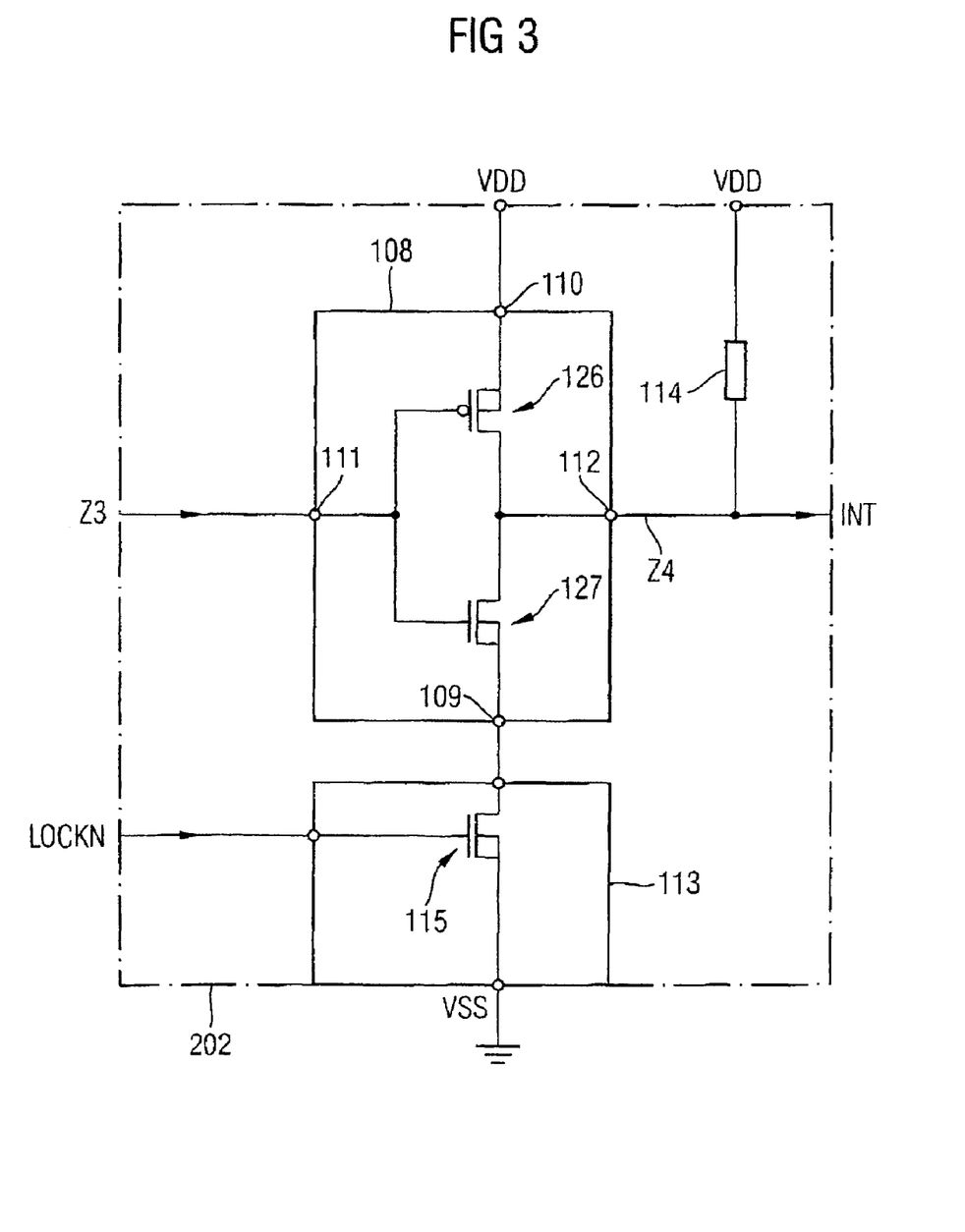
FIG. 3 shows a block diagram of one embodiment of a functional block of the circuit arrangement according to the invention.

FIG. 3 shows a circuit arrangement of a functional block 202 which produces an output signal INT that is locked to the H level when a corresponding locking signal LOCKN is supplied at the L level. The functional block 202 carries out a complementary function to the functional block 201 shown in FIG. 2.

The functional block 202 has an inverter 108 which is designed analogously to the inverter or the logic circuit 8 shown in FIG. 2. Furthermore, the functional block 202 has a controllable switch 113, which is coupled to a second supply voltage connection 109 of the inverter 108, and is coupled to the second internal supply voltage VSS, in this example ground/frame.

The controllable switch has an NMOS transistor 115 whose controllable path is used as a switching path and is controlled by its gate connection, to which the second locking signal LOCKN is connected.

The inverter has an input 111, an output 112, a first supply voltage connection 110 and a second supply voltage connection 109, with the controllable paths through a PMOS transistor 126 and an NMOS transistor 127 being connected between the supply voltage connections. The gate connections of the MOS transistors 126, 127 are coupled to the input of the inverter 108, and are thus controlled by an input control signal Z3. The output 112 of the inverter produces an output control signal Z4, which is passed to the first internal supply voltage VDD via a "weak", that is to say high-value pull-up resistor 114.

The functional block 202 operates in an analogous manner to that of the functional block 201, with the difference that the second locking signal LOCKN at the H level allows a normal inverter method of operation, while it deactivates the inverter or the logic circuit 108 when at the L level, so that an output signal INT is produced which is drawn via the high-value resistor 115 to the H level, which is referenced to the first internal supply voltage.

Figure 4:
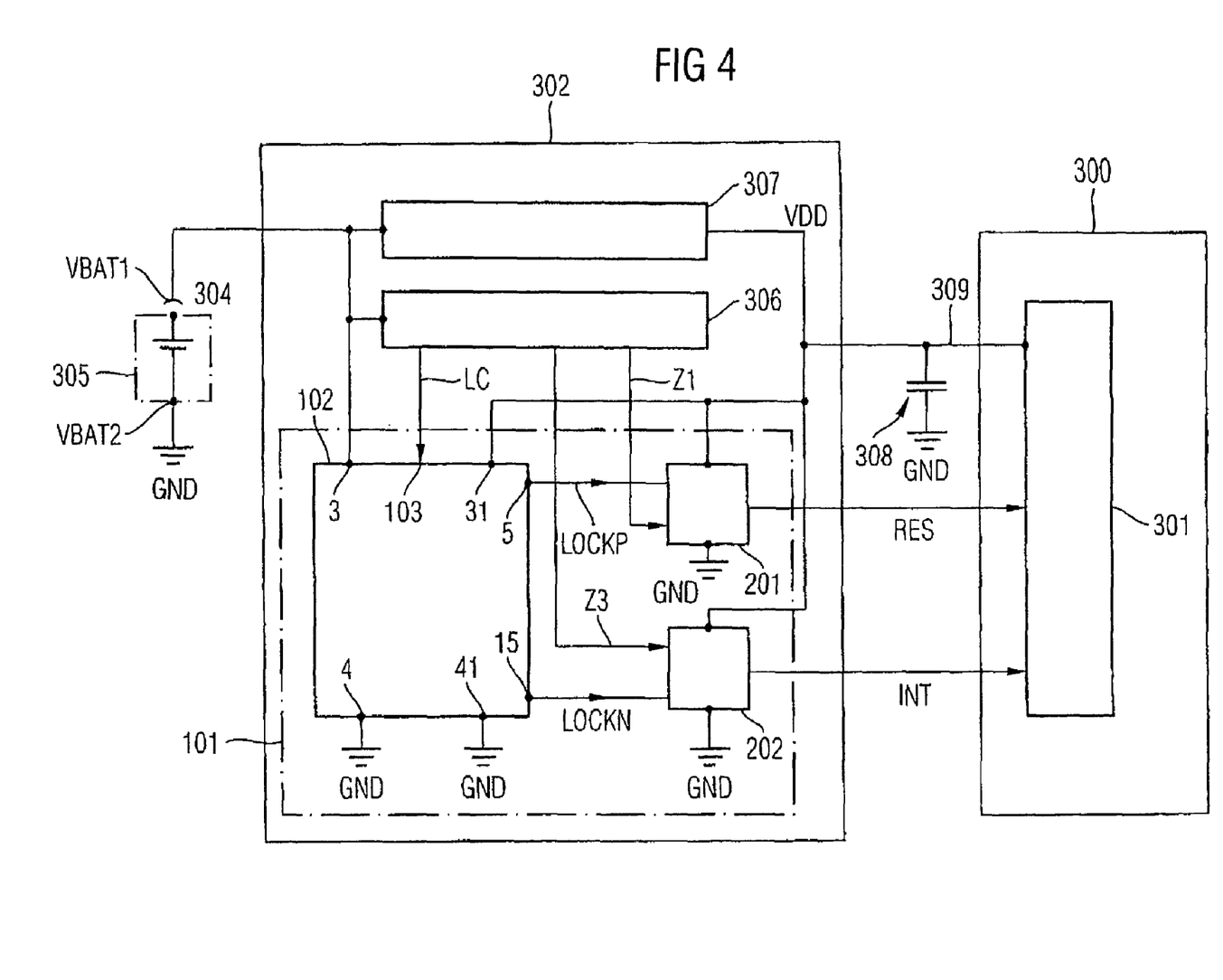
FIG. 4 shows a block diagram of one application example of the invention.

FIG. 4 shows a block diagram of one application example for a circuit arrangement according to the invention.

An advantageous development of the circuit arrangement 101 according to the invention (see FIG. 5) is accordingly provided in a power supply management unit 302, for example for a mobile telephone. The power supply management unit 302 may be designed, for example, using 5-volt BiCMOS technology and has the supply voltage connection 304 for connection of an external battery 305, which produces a first external supply voltage VBAT1. The second external supply voltage VBAT2 is connected to ground/frame GND from this point here.

The power supply management unit 302 has a battery voltage monitoring unit 306 which monitors the state of charge and the presence of the battery and emits a control signal LC which indicates whether the voltage VBAT1 being produced by the battery 305 corresponds to the nominal values for the BiCMOS circuits. The power supply management unit 302 has a voltage control unit 307 for the voltage supply for a real time clock 301 in a system control unit 300. In this case, the real time clock 301 in the system control unit 300 is designed using low-voltage technology, for example 1.8-volt CMOS technology. A corresponding internal supply voltage VDD is provided by the voltage control unit 307 from the battery voltage VBAT1.

The system control unit 300 is supplied from the power supply management unit 302 with the nominal internal supply voltage VDD of about 1.8 volts, with a large buffer capacitor 308 being coupled to the power supply line 309, which connects the power supply management unit 302 and the system control unit 300 to one another and also supplies the voltage VDD to the functional blocks 102, 201, 202 of the circuit arrangement according to the invention.

The buffer capacitor 308 ensures a temporary but decreasing supply voltage VDD to the real time clock 301 and to the circuit arrangement 101 even after removal of the battery 305, according to the advantageous development of the invention.

The circuit arrangement 101 according to the invention has functional blocks 102, 201, 202, with the functional blocks 201 and 202 corresponding to those in FIGS. 2, 3, while the block 102 will be described in more detail in the following FIG. 5.

The circuit arrangement 101 according to the invention has an input 103 for the control signal LC, which indicates whether the nominal power supply is being ensured by the battery. When the connected battery 305 is operating, the signal is at the H level, which corresponds to the battery voltage VBAT1. If the battery has been discharged or disconnected, the battery voltage monitoring unit 306 sets the control signal LC to the L level, that is to say to ground.

The circuit arrangement 101 according to the advantageous development of the invention emits a first control signal RES as a reset signal to the real time clock in the system controller 300, as well as an interrupt control signal INT, which is likewise passed to the real time clock 301.

If the battery 305 is disconnected from the power supply management unit 302, the battery voltage monitoring unit 306 sends a control signal LC to the circuit arrangement according to the invention, which then sends a reset signal RES at the L level as well as an interrupt signal INT at the H level to the real time clock, thus signalling to the latter that it should continue to carry out its function.

Since the battery 305 is no longer producing any voltage or has been disconnected, the external supply voltage VBAT1 thus falls not only as the reference value for the control signals LC, Z1, Z2 but also as the nominal internal supply voltage for the circuit arrangement 101 according to the invention and for the real time clock 301. Since, however, the real time clock 301 is designed for use in a very low-voltage domain, in this case using 1.8-volt CMOS technology, it can initially continue to operate. However, a reset signal RES and an interrupt signal INT at the appropriate levels must reliably be supplied to it. The respective, locked control signals RES, INT are produced by the circuit arrangement 101 according to the invention.

Figure 5:
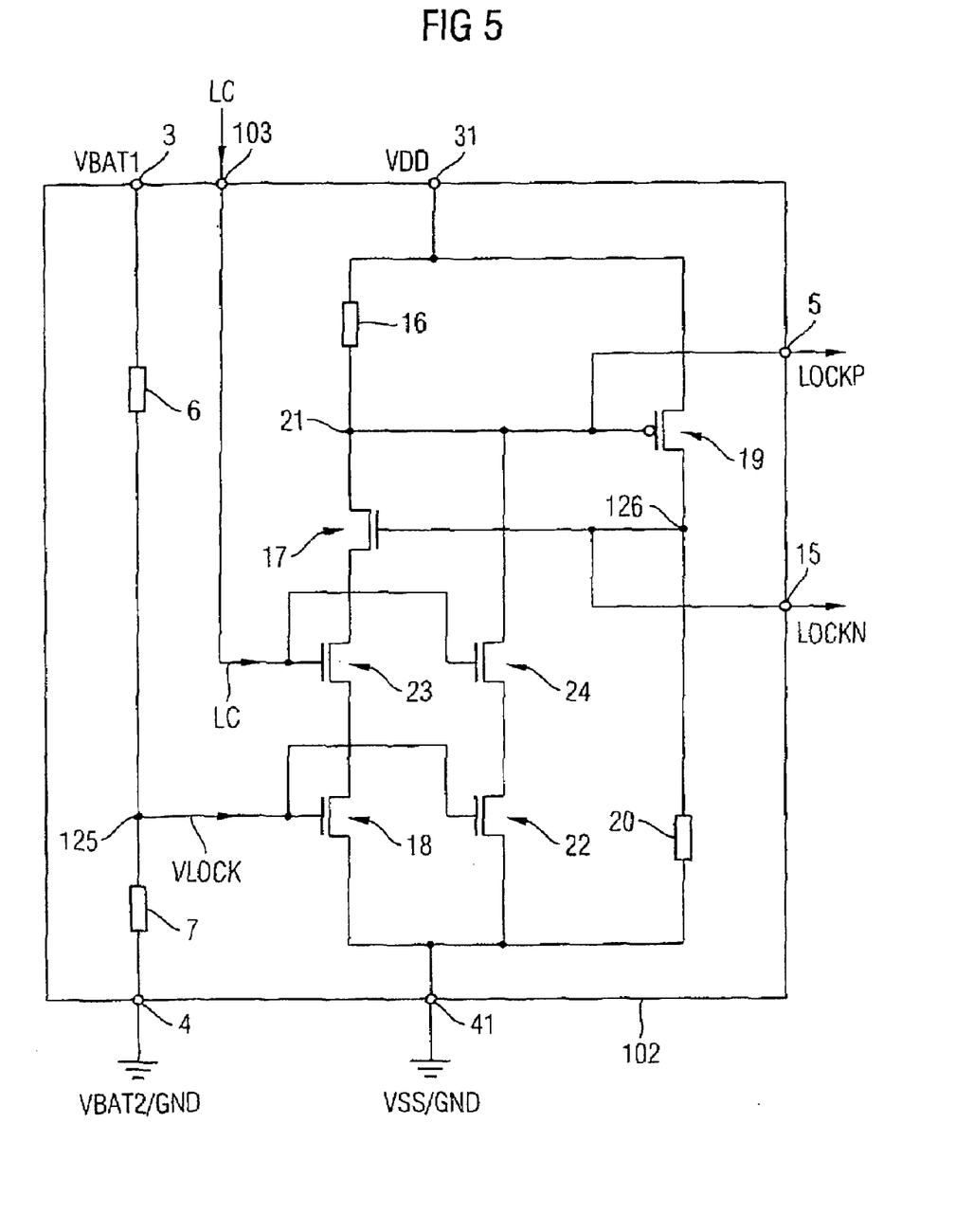
FIG. 5 shows a circuit arrangement according to the invention, based on an advantageous development of the invention.

FIG. 5 shows a circuit arrangement 102 according to the invention, based on the advantageous development as used in the exemplary embodiment shown in FIG. 3.

The block 102 as illustrated in FIG. 4 has an input 103 for the external control signal LC that is supplied from the power supply management unit 302, a first supply voltage connection 3 for application of the external battery voltage VBAT1, and a second supply voltage connection 4, which is in this case connected to ground GND. A third first supply voltage connection 31 is provided for the controlled supply voltage VDD, which controlled supply voltage VDD is supplied from the voltage control unit 307, and a fourth supply voltage connection 41, which is in this case connected to ground/frame GND. The functional block 102 also has an output 5 for emitting a first locking signal LOCKP, and an output 15 for emitting a second locking signal LOCKN.

Two resistors 6, 7 are connected as a voltage divider between the first external supply voltage VDD, the voltage VBAT1 produced by the battery 305 and ground GND or the second supply voltage connection 4, in which case a voltage potential VLOCK can be tapped off at a potential node 125 between the two resistors 6, 7.

A third resistor 16, a first MOS transistor 17 with a controllable path and a gate connection, a first control transistor 23 with a controllable path and a gate connection, and a second MOS transistor 18 with a controllable path and a gate connection are provided, with the resistor 16 and the controllable paths through the first and second MOS transistors and the control transistor 23 being connected in series between the internal supply voltage VDD and ground GND.

The external control signal LC is passed to the gate connection of the first control transistor 23, and the voltage potential VLOCK at the potential node 125 is passed to the gate connection of the second MOS transistor 18.

Furthermore, a complementary MOS transistor 19 with a controllable path and a gate connection is provided, as well as a fourth resistor 20, with the controllable path through the complementary MOS transistor 19 and the fourth resistor 20 being connected in series between the two supply voltage connections 31, 41 for the respective internal supply voltages VDD, VSS/GND.

The gate connection of the complementary MOS transistor 19 is connected to a potential node 21 between the third resistor 16 and the controllable path through the first MOS transistor 17.

The gate connection of the first MOS transistor 17 is connected to a potential node 126 between the controllable path through the complementary MOS transistor 19 and the fourth resistor 20.

A second MOS control transistor 24 with a controllable path and a gate connection, and a third MOS transistor 22 with a controllable path and a gate connection, are provided, with the controllable paths through the second MOS control transistor 24 and through the third MOS transistor 22 being connected in series between the gate connection of the complementary MOS transistor 19 and the second supply voltage connection 41 for the second internal supply voltage VSS or ground GND. The gate connection of the second MOS control transistor 24 is supplied with the external control signal LC. The gate connection of the third MOS transistor 22 is connected to the potential node between the two resistors 6, 7.

The first locking signal LOCKP can be tapped off at the gate connection of the complementary MOS transistor 19, and the second locking signal LOCKN can be tapped off at the gate connection of the first MOS transistor 19.

The first locking signal LOCKP is passed as a locking signal to a functional block 201 as is described in FIG. 2. The second locking signal LOCKN is passed to the functional block 202, which is described in FIG. 3.

During normal operation of the advantageous development 101 and in the application example as is illustrated in FIG. 4, the external control signal LC is at the H level, thus indicating that a nominal voltage supply is ensured.

During this normal operation, the control transistors 23, 24 are switched on. The resistors 6, 7 have values such that, when the supply voltage is nominal, an H level is in practice dropped at the potential node 125, so that the switching signal likewise switches on the second MOS transistor 18 and the third MOS transistor 22. The gate connection of the complementary MOS transistor 19 is then at the L level, and the first locking signal LOCKP is thus also at the L level. During this normal operation, the gate connection of the first MOS transistor 17 is then at the H level, so that the second locking signal LOCKN is also at the H level. Although the components in the functional block 102, 201, 202 are designed for nominal voltages around 2 volts, the control signals LC, Z1, Z3 are referenced to the 5-volt battery voltage. This does not damage the components.

When the first locking signal is at the L level, a controllable switch 13 which is controlled by the first locking signal LOCKP and is shown in FIG. 2 does not deactivate the corresponding logic circuit.

When the second locking signal LOCKN is at the H level, a controllable switch according to the invention and as is shown in FIG. 3 below likewise once again does not deactivate the connected logic circuit. During normal operation, the circuit arrangement 102 or 101 according to the invention does not influence the logic circuits.

In a second mode of the circuit arrangement 102 according to the invention, the locking signals LOCKP, LOCKN are changed to the blocking or locking state by the external control signal LC. This means that the first locking signal LOCKP is at the H level, while the second locking signal LOCKN is at the L level. The controllable switches 13, 113 which are driven by the locking signals LOCKP, LOCKN thus deactivate the respective logic circuits 8, 108 connected to them. The functional blocks 201, 202 therefore produce output signals RES, INT which are locked to the first supply voltage (in the case of the first locking signal LOCKP and the functional block 201 from FIG. 2) or to the second supply voltage VSS or to ground in the case of the application example shown in FIG. 4 (in the case of the second locking signal LOCKN and the functional block 202 from FIG. 3).

Thus if, in the second operating mode, the external control signal LC is at the logic L level, the two MOS control transistors 23, 24 provide isolation. The current flow through the third resistor 16 is then interrupted, and the gate connection of the complementary MOS transistor 19 is drawn to the H potential. The first locking signal LOCKP is then also at the H level. The current flow through the fourth resistor 20 is then interrupted and the fourth resistor 20 draws the gate connection of the first MOS transistor 17 to the L level. The second locking signal LOCKN is then also at the L level.

However, the signals LC, Z1, Z3 are produced in a circuit which is designed using a technology which requires the battery voltage VBAT1 for reliable operation. In this example, this is the battery voltage monitoring unit 306. If the battery voltage VBAT1 falls sharply, then the battery voltage monitoring unit 306 can no longer ensure that the levels of the control signals LC, Z1, Z3 are well-defined. For example, if the battery voltage VBAT1 is low, the signal LC which indicates the battery state can oscillate at levels around 2 volts owing to poorly operating logic circuits in the battery voltage monitoring unit 306, thus incorrectly indicating normal operation to the functional block 102. The circuit arrangement 101 according to the invention prevents this.

In a third operating state, the external supply voltage VBAT2 falls well below the corresponding nominal supply voltage. The circuit arrangement according to the invention must now change the output signals from the connected logic circuits 8, 108 to the respective safe level, which, as a reset or interrupt signal RES, INT, indicates to the real time clock 301 that it should continue to operate as a rudimentary function. This is indicated by a reset signal RES at the L level and by an interrupt signal INT at the H level. However, this H level is referenced to the internal supply voltage or to the residual voltage produced by the buffer capacitor 308.

If the external supply voltage VBAT1 is no longer sufficient to produce an external control signal LC referenced to it because the corresponding logic gates are designed for a higher nominal supply voltage and have so-called floating gates, the voltage divider 6, 7 ensures that the second and third MOS transistors 18, 24 have a high impedance.

Then, as in the second operating state described above, the third resistor 16 draws the gate of the complementary MOS transistor 19 and the first locking signal LOCKP to the H level, and the further resistor 20 draws the gate connection of the first MOS transistor 17 and the second locking signal LOCKN to the L level. In this situation, that is to say when the external supply voltage VBAT1 is falling, the use of the two resistors 6, 7 in the voltage divider can be seen as being particularly advantageous because, theoretically, the resistors can operate down to a supply voltage range of 0 volts. The locking signals LOCKP, LOCKN which are produced according to the invention thus control the controllable switches 13 as illustrated in FIG. 2, and 113 as illustrated in FIG. 5.

The circuit arrangement according to the invention thus ensures, when the supply voltage is unreliable or too low so that the logic levels of control signals such as the external control signal LC or the input signals Z1, Z3 to the logic circuits 8, 108 fluctuate or assume intermediate level values, that well-defined control signals are produced, which are locked and are referenced to the internal supply voltages (which may likewise be falling).

Owing to the use of high-value resistors, which draw the corresponding levels to one of the internal supply voltages when locking occurs, the voltage arrangement according to the invention has very low losses.

Since PMOS or NMOS transistors are provided as the controllable switches, whose gate connections are controlled by the potential on a resistive voltage divider, operation of the circuit arrangement is possible virtually to the point where a supply voltage collapses.

Although the present invention has been described above with reference to a preferred application example and with reference to preferred embodiments, it is not restricted to them but can be modified in many ways. The invention is not restricted to use in mobile radio applications or to designs using CMOS and BiCMOS technologies. In fact, the circuit arrangement according to the invention can be used whenever signal levels which have become uncertain or unreliable as a result of a voltage drop must be locked at predefined safe reference levels.

What is claimed is:

1. Circuit arrangement for monitoring an external voltage supply and for reliable locking of a signal, which is emitted from a logic circuit, at a voltage level of an internal voltage supply, having:
   (a) a voltage divider, which is connected between a first and a second external supply voltage and produces a potential level for a switching signal;
   (b) a controllable switch which separates the internal voltage supply, which has a first and a second internal supply voltage, from the logic circuit in order to deactivate the latter as a function of a locking signal which is produced from the switching signal, and
   (c) a high-value resistor by means of which the signal which is emitted from the deactivated logic circuit is drawn to the level of one of the two internal supply voltages.

2. Circuit arrangement according to claim 1, wherein the logic circuit processes an input signal, which is referenced to the external supply voltages, and the voltage divider is designed such that the locking signal deactivates the logic circuit before the level or levels of the input signal becomes or become unacceptable in the event of a drop in the external supply voltages.

3. Circuit arrangement according to claim 1, wherein
   (a) a monitoring circuit is provided, which has a first supply voltage connection for application of the first external supply voltage, a second supply voltage connection for application of the second external supply voltage, and at least one output for emission of the locking signal, wherein at least two resistors are connected as a voltage divider between the supply voltage connections, and the locking signal is produced as a function of a voltage potential which can be tapped off between the resistors;
   (b) the logic circuit has a first supply voltage connection and a second supply voltage connection for application of the second internal supply voltage, a control signal input for the input signal, and an output for the signal produced by the logic circuit;
   (c) the controllable switch is provided between the first internal supply voltage and the first supply voltage connection of the logic circuit, and the controllable switch connects the first internal supply voltage to the first supply voltage connection of the logic circuit as a function of the locking signal; and
   (d) the high-value resistor is connected between the output of the logic circuit and the second internal supply voltage.

4. Circuit arrangement according to claim 1, wherein the internal and external first supply voltages and the internal and external second supply voltages are each at the same voltage level.

5. Circuit arrangement according to claim 3, wherein the monitoring circuit
   (a) has a third supply voltage connection for application of the first internal supply voltage, and has a fourth supply voltage connection for application of the second internal supply voltage;

(b) has a third resistor, a first MOS transistor with a controllable path and a gate connection, and a second MOS transistor with a controllable path and a gate connection, wherein the third resistor and the two controllable paths are connected in series between the two internal supply voltages and the switching signal is connected to the gate connection of the second MOS transistor, (c) has a complementary MOS transistor with a controllable path and a gate connection, and has a fourth resistor, wherein the controllable path through the complementary MOS transistor and the fourth resistor are connected in series between the two internal supply voltages, the gate connection of the complementary MOS transistor is connected to a potential node between the third resistor and the controllable path through the first MOS transistor, and the gate connection of the first MOS transistor is connected between the controllable path through the complementary MOS transistor and the fourth resistor; and (d) has a third MOS transistor with a controllable path and a gate connection, wherein the controllable path through the third MOS transistor is connected between the gate connection of the complementary MOS transistor and the second internal supply voltage, and the switching signal is connected to the gate connection of the third MOS transistor; and wherein (e) a first locking signal can be tapped off at the gate connection of the complementary MOS transistor, and a second locking signal can be tapped off at the gate connection of the first MOS transistor.

6. Circuit arrangement according to claim 5, wherein the monitoring circuit has a first and a second MOS control transistor, each having a controllable path and a gate connection, wherein the controllable path through the first MOS control transistor is connected between the controllable path through the first and through the second MOS transistor, the controllable path through the second MOS control transistor is connected between the gate connection of the complementary MOS transistor and the controllable path through the third MOS transistor, and wherein an external control signal is applied to the gate connections of the two MOS control transistors.

7. Circuit arrangement according to claim 1, wherein the controllable switch has an MOS switching transistor with a controllable path and a gate connection, wherein the locking signal is connected to the gate connection of the MOS switching transistor, and the controllable path through the MOS switching transistor is connected between one of the internal supply voltages and a supply voltage connection of the logic circuit.

8. Circuit arrangement according to claim 1, wherein the logic circuit has an inverter as the output driver.

9. Circuit arrangement according to claim 1, wherein the circuit arrangement is designed using a first MOS technology, and the control signals from the logic circuits drive circuits which are designed using a second technology.

10. Circuit arrangement according to claim 8, wherein the first technology operates at higher supply voltages than the second technology.

* * * * *